(12) United States Patent  (10) Patent No.: US 6,693,457 B2
Yepp  (45) Date of Patent: Feb. 17, 2004

(54) ULTRA HIGH SPEED FLIP-FLOP (75) Inventor: Ronald J. Yepp, Redondo Beach, CA (US)

(73) Assignee: Northrop Grumman Corporation, Los Angeles, CA (US)

(*) Notice: Subject to any disclaimer, the term of this patent is extended or adjusted under 35 U.S.C. 154(b) by 0 days.

(21) Appl. No.: 10/199,921

(22) Filed: Jul. 18, 2002

(65) Prior Publication Data

US 2004/0012408 A1 Jan. 22, 2004

(51) Int. Cl.[7] .................................. H03K 19/0175
(52) U.S. Cl. ....................... 326/63; 326/62; 326/75; 326/77; 326/78
(58) Field of Search .................. 326/62, 63, 66, 326/67, 73, 74, 77, 78, 80; 327/199–204

(56) References Cited

U.S. PATENT DOCUMENTS 4,692,641 A * 9/1987 Highton ...................... 307/475
5,068,551 A    11/1991 Bosnyak
5,117,124 A     5/1992 Dicke
5,220,212 A     6/1993 Sinh
5,815,019 A     9/1998 Uemura et al.
5,900,760 A *   5/1999 Lee ............................. 327/202

* cited by examiner

Primary Examiner—Anh Tran
(74) Attorney, Agent, or Firm—Tarolli, Sundheim, Covell & Tummino L.L.P.

(57) ABSTRACT

An ultra high speed Emitter Coupled Logic (ECL) flip-flop is provided and a method of operating the same. The ECL flip-flop provides for clock levels that operate at logic levels above the data levels. Since the clock operates at logic levels above the data, the clock experiences level shifts that are less than the level shifts of the data. Therefore, the clock will provide a higher fidelity signal relative to the conventional clock signal. The ECL flip-flop can operate at significantly higher data rates than conventional flip-flop circuitry.

20 Claims, 7 Drawing Sheets

ULTRA HIGH SPEED FLIP-FLOP

TECHNICAL FIELD

The present invention relates generally to electrical circuits, and more particularly to an ultra high speed flip-flop.

BACKGROUND OF THE INVENTION

One major limitation of modern digital systems is the rate at which data may be transferred from one point to another. For example, in high speed computing systems where signal frequencies in excess of 100 MHZ may be found, ECL (Emitter Coupled Logic) or Current Mode Logic (CML) is often used. ECL is currently the fastest form of logic, since the active devices are arranged to operate out of saturation. ECL can provide even faster speeds by arranging that the logic signal swings are relatively small. The time required for charging and discharging various load and parasitic capacitances is quite short. ECL circuits are often preferred in high speed applications, such as telecommunication applications where increases in bit rates require increased speed of the operation of logical circuits. In these type of applications, flip-flop devices are often used to transfer data at high rates of speed.

Even though, ECL is very fast in comparison to other forms of logic, it is still provided with its limitations. Additionally, the material (e.g., Indium Phosphide (InP), Gallium Arsenide (GaA), Silicon (Si)) that the devices are constructed of has certain limitations. Presently, Gallium Arsenide (GaA) devices can operate at frequencies up to about 100 GigaHertz (GHZ), and Indium Phosphide (InP) devices can operate at frequencies up to about 300 GHZ. Gallium Arsenide (GaA) devices and Indium Phosphide (InP) are widely used in wireless and fiber optic transmission applications. As the devices begin operating at the upper range of the material, devices such as flip-flops begin to oscillate and do not operate properly. Since ECL devices are based on the use of emitter follower devices, the ECL device operate in several different logic levels that are typically separated by one or more diode drops (e.g., approximately 0.8 volt intervals). The level shifting to the different logic levels can provide additional delay to the operation of the ECL device, which can also influence the operational speed of the ECL device.

Figure 1:
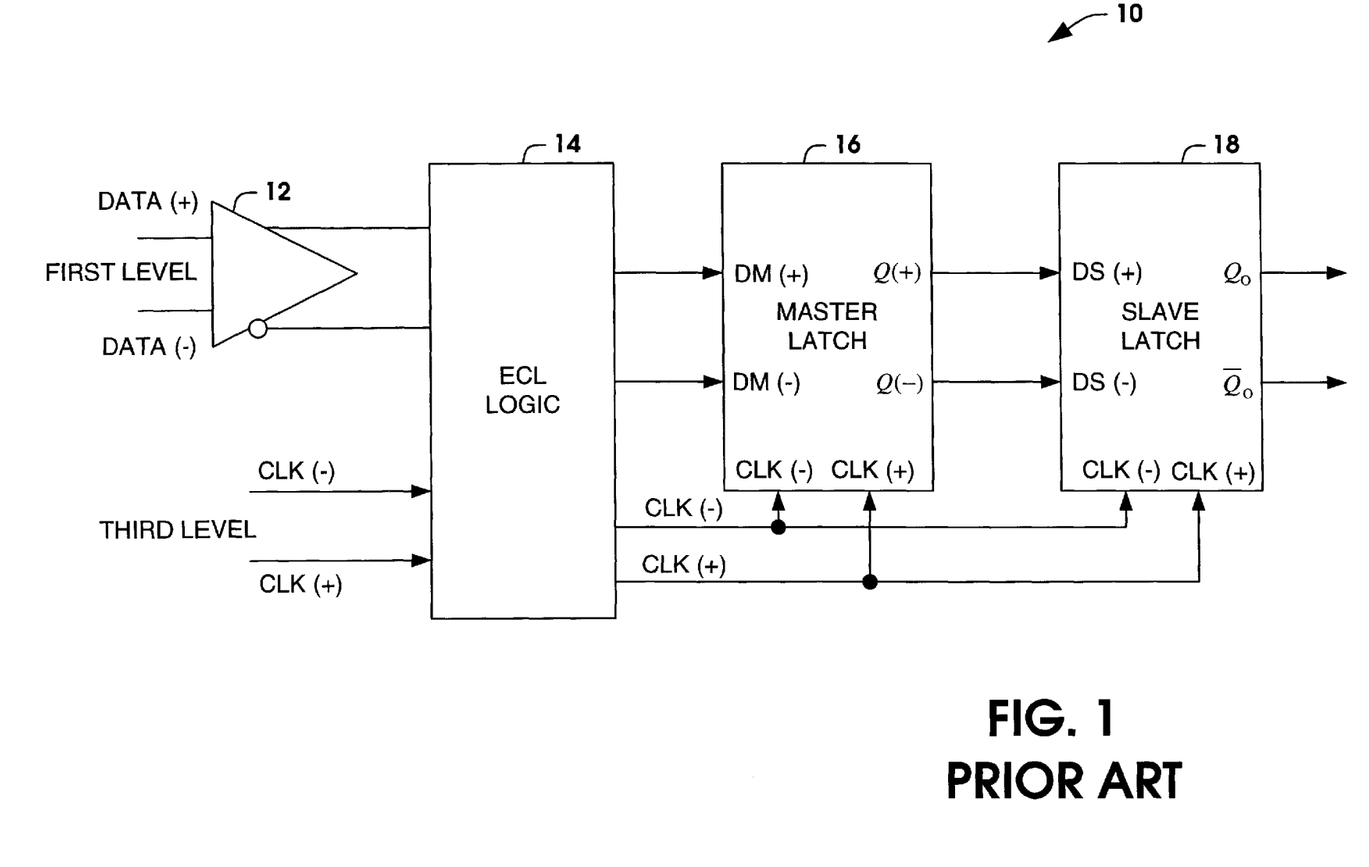
FIG. 1 illustrates a schematic block diagram of a conventional ECL flip-flop.

FIG. 1 illustrates a conventional ECL flip-flop 10 having a master latch portion 16 and a slave latch portion 18. The master latch portion 16 and the slave latch portion 18 alternate between a holding state and a latching state. A differential data input (DATA (+) and DATA (−)) is provided to an open loop differential amplifier 12 that is coupled to an ECL logic component 14. The differential data input is level shifted down from ground to a first logic level (e.g., −0.8 v to −1.6 v) through, for example, a single emitter follower (not shown). The differential data input then transitions between logic highs and lows at the first logic level. The ECL logic component 14 also receives a differential clock input signal (CLK (+) and CLK (−)). The clock input is level shifted down from ground to a third logic level (e.g., −0.2.4 v to −3.2 v) through, for example, three cascaded emitter followers (not shown). The differential clock input signal then transitions between logic highs and lows at the third logic level.

The open loop differential amplifier 12 cooperates with the ECL logic component 14 to latch data transitions of the data input through the master latch portion 16 and the slave latch portion 18 of the flip-flop 10. The frequency of the clock signal needs to be about twice the frequency of the data rate to provide proper operation of the flip-flop 10. As the data is transmitted through the flip-flop 10 at very high frequencies (e.g., 30–60 GHZ), the level shifting of the clock through three cascaded emitter followers creates a stability problem causing the flip-flop to oscillate and not operate properly. Therefore, limiting the operational speed of the flip-flop.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor delineate the scope of the invention. Its sole purpose is to present some concepts of the invention in a simplified form as a prelude to the more detailed description that is presented later.

The present invention relates to an ultra high speed ECL flip-flop and a method of operating the same. A high frequency differential clock signal is level shifted to a first ECL logic level or voltage level range prior to being provided to the ultra high speed ECL flip-flop. The data signal is level shifted to a second or a third ECL logic level or a second or third voltage level range prior to being provided to the ultra high speed ECL flip-flop. An ECL logic component executes a clock function at the first logic level, while data is being provided to a closed loop differential amplifier at the second or third logic level. The ECL logic component and the closed loop differential amplifier cooperate to clock in data signals to a master latch portion of the ultra high speed ECL flip-flop. The master latch portion is designed to interact with the ECL logic component and the closed loop differential amplifier at the desired logic levels. The data signals are then provided to a slave latch portion of the ECL flip-flop, which latches the data signals to the output of the slave latch portion on the next clock transition.

The ECL flip-flop of the present invention can operate at significantly higher data rates than conventional flip-flop circuitry. For example, data rates from about 30 GHZ to about 60 GHZ can be achieved, since the clock input signal only experiences a single level shift. The clock signal operates at about twice the frequency of the data signal. Therefore, the level shifting the data below the clock signals provides additional bandwidth to the ECL flip-flop. Additionally, distortion is mitigated by providing a closed loop differential amplifier for receiving the data signals. The ECL flip-flop can be formed from a variety of different materials (Indium Phosphide (InP), Gallium Arsenide (GaA), Silicon (Si)), such that the outer bandwidth range of the materials is extended by the configuration of the ECL flip-flop regardless of the material type.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents.

Other advantages and novel features of the invention will become apparent from the following detailed description of the invention when considered in conjunction with the drawings.

DETAILED DESCRIPTION OF INVENTION

The present invention provides for an ultra high speed ECL flip-flop and a method of operating the same. The ECL flip-flop of the present invention provides for clock levels that operate at logic levels above the data levels. Since the clock operates at logic levels above the data, the clock experiences level shifts that are less than the level shifts of the data. Therefore, the clock will provide a higher fidelity signal relative to the conventional clock signal. The ECL flip-flop of the present invention can operate at significantly higher data rates than conventional flip-flop circuitry. The ECL flip-flop can be formed from a variety of different materials (Indium Phosphide (InP), Gallium Arsenide (GaA), Silicon (Si)), such that the outer bandwidth range of the materials is extended by the configuration of the ECL flip-flop regardless of the material type.

Figure 2:
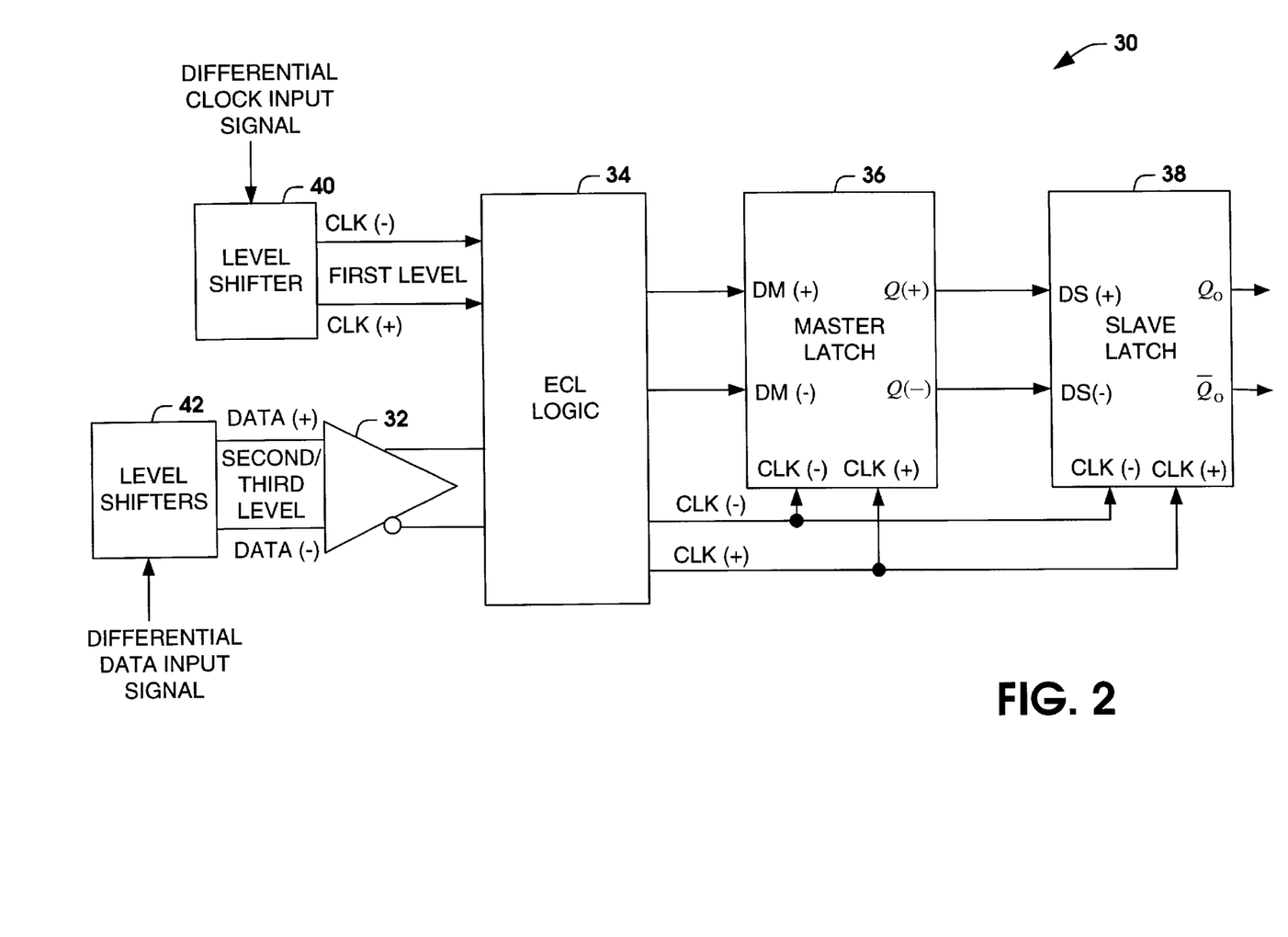
FIG. 2 illustrates a schematic block diagram of an ECL flip-flop in accordance with an aspect of the present invention.

FIG. 2 illustrates an ECL flip-flop 30 (e.g., ECL D-flip-flop) in accordance with an aspect of the present invention. The ECL flip-flop 30 includes a master latch portion 36 and a slave latch portion 38. The master latch portion 36 and the slave latch portion 38 alternate between a holding state and a latching state. A differential data input signal (DATA (+) and DATA (−)) is provided to an open loop differential amplifier 32 that is coupled to an ECL logic component 34. The differential data input signal is level shifted down from ground to a second ECL logic level (e.g., −0.1.6 v to −2.4 v) or voltage range or a third ECL logic level (e.g., −0.2.4 v to −3.2 v) or voltage range employing at least two level shifters 42 (e.g., two cascaded emitter followers). The differential data input signal then transitions between logic highs and lows at the second or third ECL logic level at a high frequency (e.g., 50 GHZ).

The ECL logic component 34 also receives a differential clock input signal (CLK (+) and CLK (−)). The differential clock input signal is level shifted down from ground to a first ECL logic level (e.g., −0.0.8 v to −1.6 v) or voltage range through a level shifter 40 (e.g., a single emitter follower). The clock input then transitions between logic highs and lows at the first ECL logic level at a frequency (e.g., 100 GHZ) about twice the frequency of the data input signal. The open loop differential amplifier 32 cooperates with the ECL logic 34 to latch data transitions of the data input signal through the master latch portion 36 and the slave latch portion 38 of the flip-flop 30. As the data is transmitted through the flip-flop 30 at very high frequencies (e.g., 30–60 GHZ), the clock input is only level shifted through a single emitter follower. This reduces the delay in the clock and provides improved stability to the overall circuit performance. The data input logic levels are below the clock logic levels, which does not effect the stability of the data input logic since the data input signal transitions execute at about one half the frequency of the clock input signal.

Figure 3:
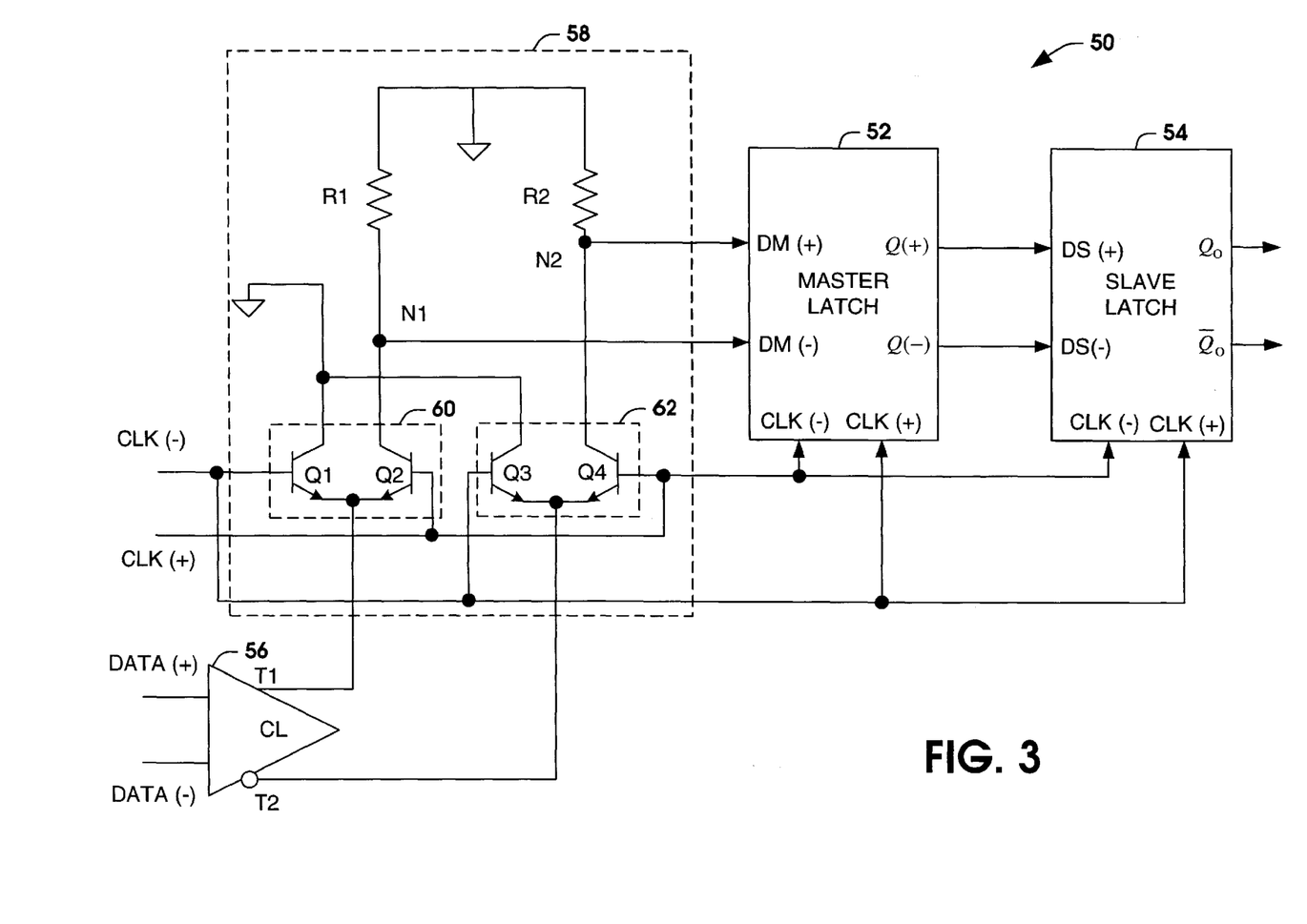
FIG. 3 illustrates a schematic block diagram of an ECL flip-flop employing a closed loop differential amplifier in accordance with an aspect of the present invention.

FIG. 3 illustrates a schematic block diagram of an ECL flip-flop 50 in accordance with another aspect of the present invention. The ECL flip-flop 50 includes a master latch portion 52 and a slave latch portion 54. The master latch portion 52 and the slave latch portion 54 alternate between a holding state and a latching state. A differential data input signal (DATA (+) and DATA (−)) is provided to a closed loop differential amplifier 56. The closed loop differential amplifier 56 extends the bandwidth and reduces the distortions that occur in the data waveform by employing feedback. The closed loop differential amplifier 56 linearizes the data waveform, and mitigates the distortion of the data waveform at very high frequencies associated with a conventional open loop differential amplifier. The differential data input signal is level shifted down from ground to a second logic level or a third logic level through cascaded emitter followers (not shown). The differential data input signal then transitions between logic highs and lows at the second or third logic level at a high frequency.

The data kickback current which is in the current required to charge and discharge an open loop data input to an open loop differential amplifier is significantly reduced by employing the closed loop differential amplifier 56. The kickback current occurs when the open loop differential pair is extended due to rise and fall time constraints. The data kickback current produces distortions in the input data waveform. The distortion is reduced by utilizing the closed loop differential amplifier 56 since the input current can be controlled and determined. The distortion of the output waveform is attributed to the bandwidth limitation of the particular technology or material in which the ECL flip-flop is fabricated. The closed loop differential amplifier 56 extends this bandwidth limitation by the natural characteristics of open loop versus closed loop functions. As a result, the closed loop differential amplifier 56 produces high fidelity low distortion waveforms.

The closed loop amplifier 56 is coupled to an ECL logic component 58. The ECL logic component 58 is comprised of a first differential pair 60 and a second differential pair 62. The first differential pair 60 includes a transistor Q1 and a transistor Q2, and the second differential pair 62 includes a transistor Q3 and a transistor Q4. The transistors Q1–Q4 are bipolar junction transistors (BJTs). The collector of the transistor Q2 is connected to a resistor R1 through a first node N1, and the collector of transistor Q4 is connected to a resistor R2 through a second node N2. The resistor R1 and the resistor R2 are also connected to ground. The base of the transistor Q1 and the base of the transistor Q3 receive a negative rail clock input signal CLK (−), while the base of the transistor Q2 and the base of the transistor Q4 receive a positive rail clock input signal CLK (+). The positive rail clock input signal CLK (+) and the negative rail clock input signal CLK (−) are level shifted down from ground to a first logic level (e.g., −0.0.8 v to −1.6 v) through, for example, a single emitter follower (not shown) to provide a differential clock input signal. The differential clock input signal transitions between logic highs and lows at the first logic level. The positive rail clock input signal CLK (+) is provided to the negative clock rail of the master latch portion 52 and the slave latch portion 54, while the negative rail clock input signal CLK (−) is provided to the positive clock rail of the master latch portion 52 and the slave latch portion 54. This is due to the inversion caused by providing feedback in the closed loop differential amplifier 56.

The positive rail clock input signal CLK (+) and the negative rail clock input signal CLK (−) latch data transitions of the differential data input signal through the master latch portion 52 and the slave latch portion 54 of the flip-flop 50. For example, if the data (+) is low and data (−) is high, current will not flow through terminal T1 of the closed loop differential amplifier 56, while current will flow through the terminal T2 of the closed loop differential amplifier 56. As the differential clock input signal alternates, the transistor Q1 and Q2 will alternate between "ON" and "OFF" states, and the transistors Q3 and Q4 will alternate between "ON" and "OFF" states. During a positive clock transition, Q2 and Q4 will turn to an "ON" state and current will flow through one of the transistors based on current flowing through either terminal T1 or T2 associated with the state of the data transition.

For example, if current is flowing through terminal T1 during a positive clock transition, current will flow through transistor Q2 and resistor R1 pulling the node N1 to a lower voltage level than the node N2, since no current will flow through the terminal T2 and the transistor Q4. Therefore, a logic high will be provided to the master latch portion 54 since DM (+) is of a higher potential than DM (−). If current is flowing through the terminal T2 during a positive clock transition, current will flow through the transistor Q4 and the resistor R2 pulling node N2 to a lower voltage level than the node N1, since no current will conduct through the terminal T1 and the transistor Q2. Therefore, a logic low will be provided to the master latch portion since DM (−) is of a higher potential than DM (+). The data will then be latched by the master latch portion 52 of the flip-flop 50, which is latched to the input of the slave latch portion 54. During the next clock transition the data is latched to the output of the slave portion 54.

Figure 4:
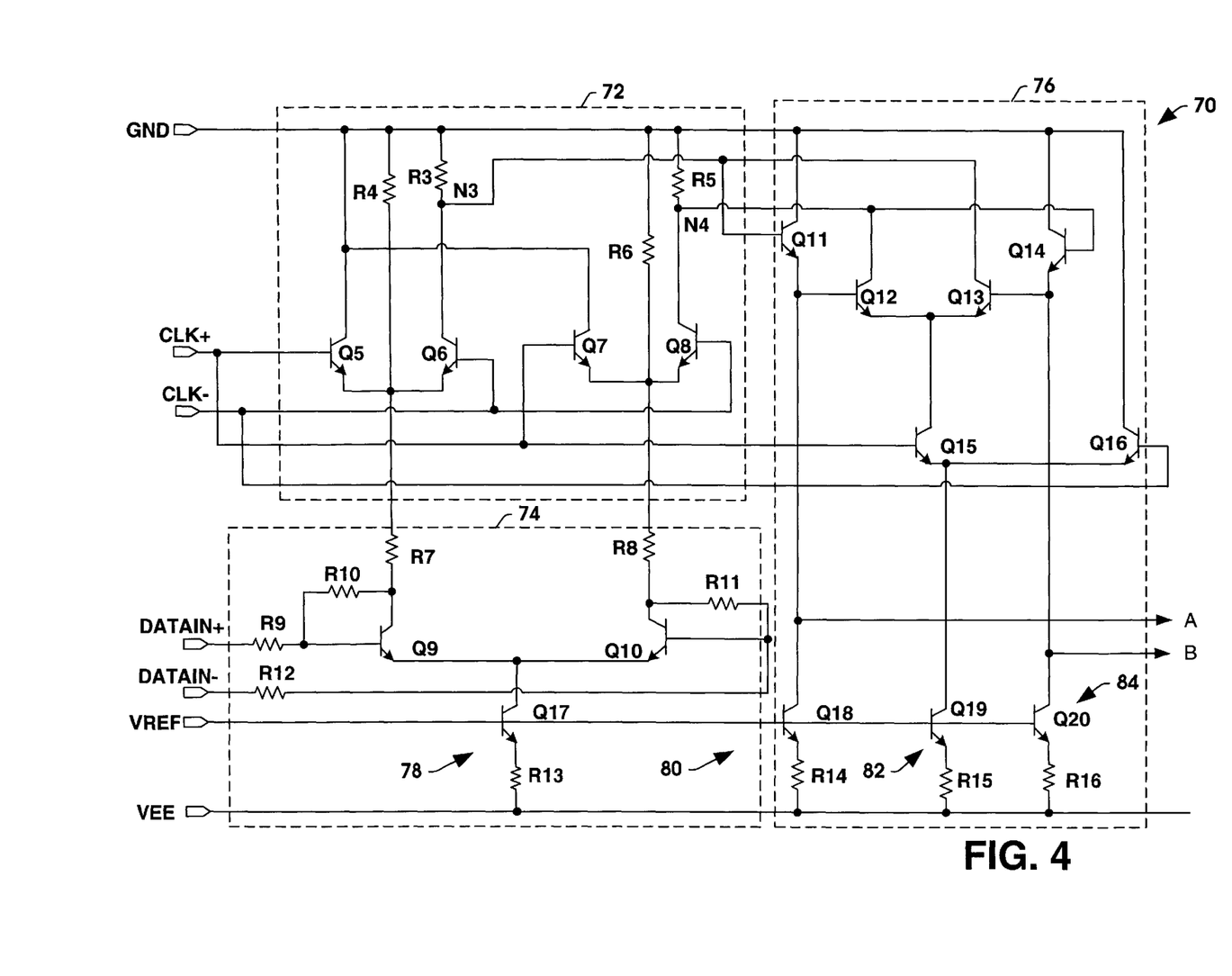
FIG. 4 illustrates a detailed schematic of a master latch portion of an ECL flip-flop in accordance with an aspect of the present invention.

FIG. 4 illustrates a detailed schematic of a portion of an ECL flip-flop 70 in accordance with an aspect of the present invention. The ECL flip-flop 70 includes an ECL logic portion 72, a closed loop differential amplifier portion 74 and a master latch portion 76. The closed loop differential amplifier portion 74 includes a differential pair comprising a transistor Q9 and a transistor Q10. The transistor Q9 includes feedback resistors R10 and R9 and the transistor Q10 includes feedback resistors R11 and R12. The feedback resistors mitigate the distortion of the data waveform at very high frequencies. A current sink 78 formed of a transistor Q17 and a resistor R13 is coupled to the emitters of the transistors Q9 and Q10.

The ECL logic component 72 is comprised of a first differential pair and a second differential pair. The first differential pair includes a transistor Q5 and a transistor Q6 and the second differential pair includes a transistor Q7 and a transistor Q8. The collector of the transistor Q6 is connected to a resistor R3 through a first input node N3. The collector of the transistor Q8 is connected to a resistor R5 through a second input node N4. The resistor R3 and the resistor R5 connect the node N3 and the node N4, respectively, to ground.

A resistor R4 is connected between the emitters of the transistor Q5 and Q6 and ground. A resistor R7 is connected between the emitters of the transistor Q5 and Q6 and the collector of the transistor Q9 of the closed loop differential amplifier 74. The resistors R4 and R7 provide a voltage bias at the emitters of the transistor Q5 and Q6. A resistor R6 is connected between the emitters of transistor Q7 and Q8 and ground. A resistor R8 is connected between the emitters of transistor Q7 and Q8 and the collector of the transistor Q10 of the closed loop differential amplifier 74. The resistors R6 and R8 provide a voltage bias at the emitters of transistor Q7 and Q8.

The master latch portion 76 of the flip-flop 70 includes an outer differential pair coupled to an inner differential pair that handles data transitions at the node N3 and the node N4. The outer differential pair is comprised of transistors Q11 and Q14 and the inner differential pair is comprised of transistors Q12 and Q13. The master latch portion 76 of the flip-flop 70 also includes a differential pair comprised of a transistor Q15 and a transistor Q16 that handles the clocking function. A current sink 80, formed of a transistor Q18 and a resistor R14, is coupled to the emitter of the transistor Q11 and the base of the transistor Q12, while a current sink 84, formed of a transistor Q20 and a resistor R16, is coupled to the emitter of Q14 and the base of Q13. A current sink 82 formed of a transistor Q19 and a resistor R15 is coupled to the emitters of the transistor Q15 and the transistor Q16.

During normal operation, the base of the transistor Q6 and the base of the transistor Q8 receive a negative rail clock input signal CLK (−), while the base of the transistor Q5 and Q7 receive a positive rail clock input signal CLK (+). The positive rail clock input signal CLK (+) and the negative rail clock input signal CLK (−) signal are level shifted down from ground to a first logic level (e.g., −0.0.8 v to −1.6 v) through, for example, a single emitter follower (not shown). The positive rail clock input signal CLK (+) and the negative rail clock input signal CLK (−) signal formed a differential clock input signal. The differential clock input signal transitions between logic highs and lows at the first logic level. The data input is level shifted to a second logic level (e.g., −1.6 to −2.4) below the logic level of the differential clock input signal. As data is received by the closed loop differential amplifier 74, the transistors Q9 and Q10 will turn "ON" and "OFF," steering current from the ECL logic component 72 through the turned on transistor. The positive rail clock input signal CLK (+) and the negative rail clock input signal CLK (−) signal also transition between opposing logic states turning transistors Q5 and Q7 "ON" and "OFF" and transistors Q6 and Q8 "ON" and "OFF," respectively.

When the transistors Q6 and Q8 are turned "ON," current is steered through the turned "ON" transistor when the respective coupled transistor Q9 and Q10 is turned "ON" based on the data state, thus, providing a voltage below ground at one of the nodes N3 and N4. Thus, a differential logic state is provided based on the voltage levels at the nodes N3 and N4. For example, if the node N3 has a voltage below the node N4, the data is a logic low, while if the node N3 has a voltage above the node N4, the data is a logic high. The data is then provided to the master latch portion 76 of the flip-flop 70. The master latch portion 76 of the flip-flop 70 is operative to accept the data from the ECL logic component 72 at a second logic level and accept the differentia clock input signal at the first logic level. The differential pair comprising Q15 and Q16 receive the clock input signal, and turn "ON" and "OFF" between opposing states controlled by the differential clock input signal. The outer differential pair and the inner differential pair receive the differential data input signal from the nodes N3 and N4, which turns "ON" the appropriate transistors to provide output data to an output node "A" and an output node "B." The logic state associated with the output node "A" and the output node "B" is latched upon a differential clock input signal transition.

Figure 5:
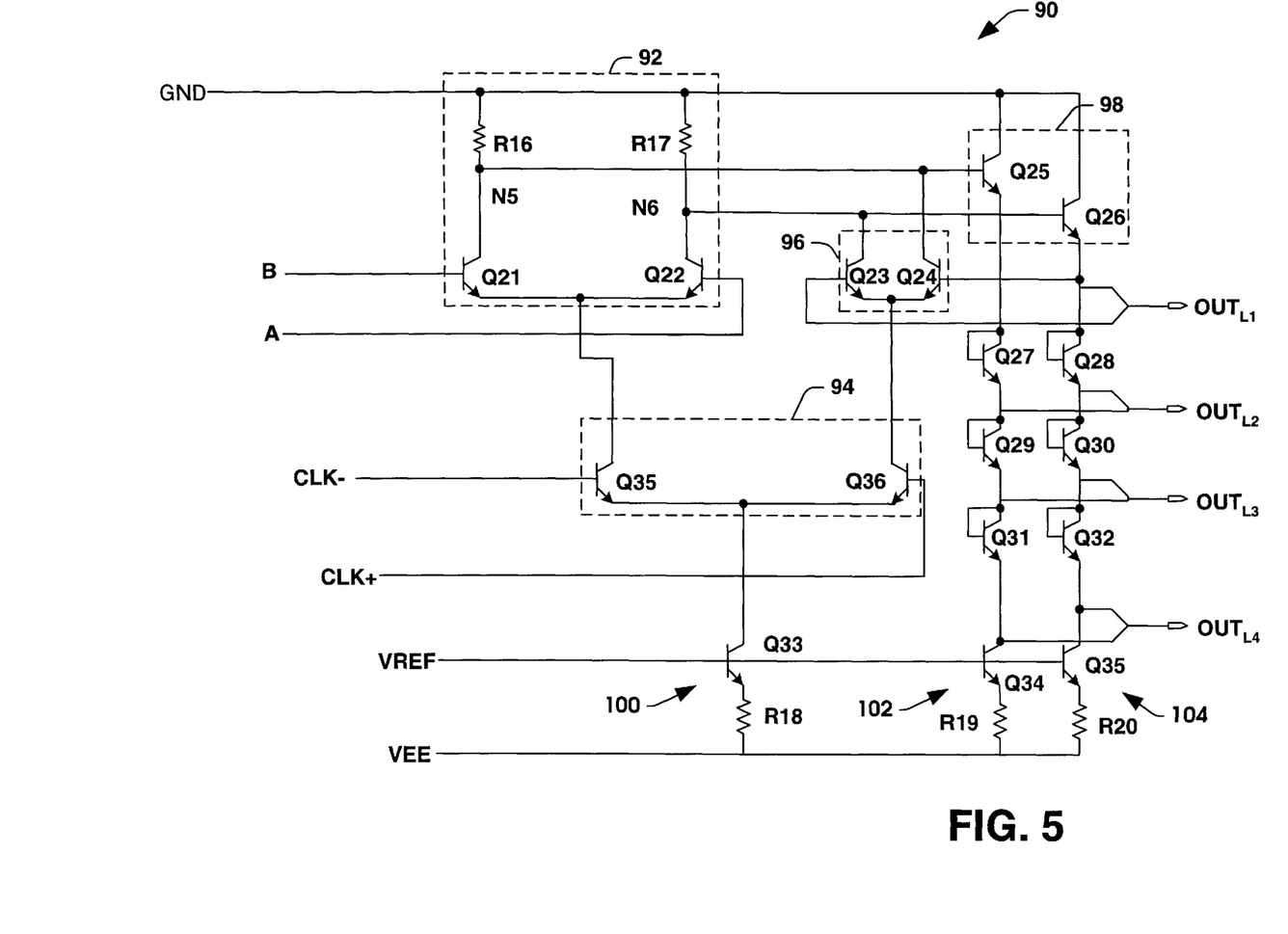
FIG. 5 illustrates a detailed schematic of a slave latch portion of an ECL flip-flop in accordance with an aspect of the present invention.

FIG. 5 illustrates detailed schematic of a slave portion 90 of the ECL flip-flop 70 of FIG. 4. The slave portion 90 includes a first differential pair 92 that receives the data input signal "A" and the data input signal "B" from the master latch portion 76 of the ECL flip-flop 70, and a second differential pair 94 that receives the differential clock input signal (CLK (+) and CLK (−)). The first differential pair 92 is comprised of a transistor Q21 having a base coupled to the B input signal and a transistor Q22 having a base coupled to the A input signal. The collector of the transistor Q21 is coupled to a resistor R16 through a node N5, and the collector of the transistor Q22 is coupled to a resistor R17 through a node N6. The resistor R16 couples the node N5 to ground and the resistor R17 couples the node N6 to ground. The second differential pair 94 is comprised of a transistor Q35 having a base coupled to the positive rail clock input signal CLK (+) and a transistor Q36 having a base coupled to the negative rail clock input signal CLK (−). A current sink 100, formed of a transistor Q32 and a resistor R18, is coupled to the emitters of the transistor Q35 and Q36. The slave latch portion 90 includes a latch circuit 96 comprised of transistor Q23 and Q24, and a driver portion 98 comprised of transistors Q25 and Q26.

The logic state of N5 and N6 are provided by the output driver transistors Q25 and Q26 to provide a differential output ($OUT_{L1}$) at a first logic level (e.g., −0.8 to −1.6). A first set of emitter followers comprised of transistors Q27 and Q28 provide an output ($OUT_{L2}$) at a second logic level (e.g., −0.1.6 to −2.4), a second set of emitter followers comprised of transistors Q29 and Q30 provide an output ($OUT_{L3}$) at a third logic level (e.g., −0.2.4 to −3.2), and a third set of emitter followers comprised of transistors Q31 and Q32 provide an output ($OUT_{L4}$) at a fourth logic level (e.g., −0.2.4 to −3.2). A current sink 102 formed of a transistor Q34 and a resistor R19 and a current sink 104 formed of a transistor Q35 and a resistor R20 are coupled to the emitters of the transistor Q30 and Q32, respectively, to provide sink currents for level shifting of all the emitter followers.

During operation, a differential data input signal is provided at the input signal "A" and "B," which turns "ON" either the transistor Q21 or the transistor Q22. Current is drawn through the transistor Q35 that is turned "ON" when the negative rail clock input signal CLK (−) is a logic high providing a differential data logic signal at the nodes N5 and N6. The differential data logic signal at the nodes N5 and N6 is latched by the latch circuit 96 when the positive rail clock input signal CLK (+) provides a logic high. The differential data signal is also provided to the driver transistors Q25 and Q26, which provides the data as output of the slave latch portion 90 of the ECL flip-flop 70.

Figure 6:
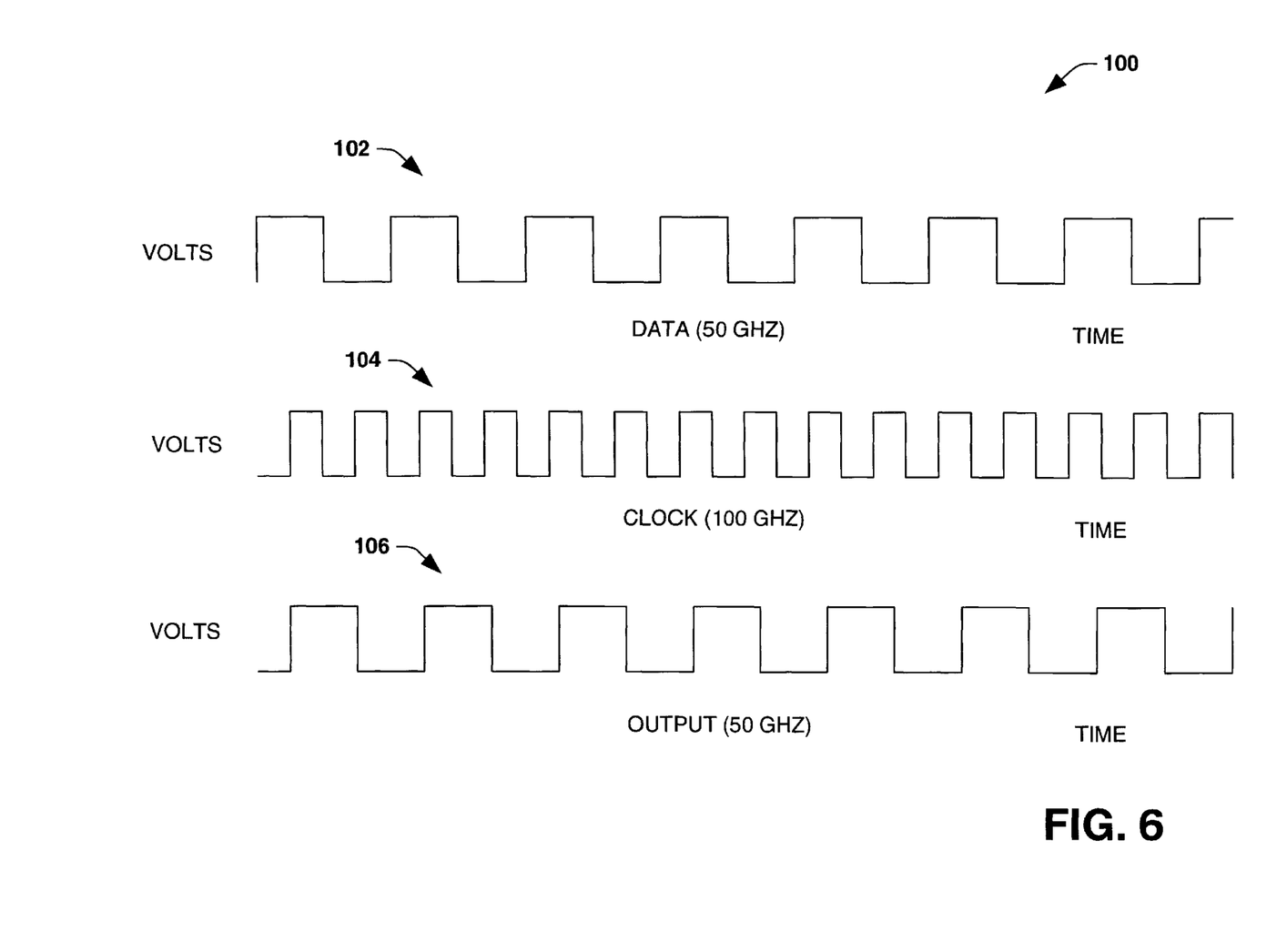
FIG. 6 illustrates a graph of volts versus time of various signals of an ECL flip-flop in accordance with an aspect of the present invention.

FIG. 6 illustrates a graph 100 of voltage versus time of various signals of the ECL flip-flop in accordance with an aspect of the present invention. It is to be appreciated that the signals in the graph 100 are shown in ideal form and are for illustrative purposes only. Therefore, due to the extremely high frequency of the signals, variations in the ideal signals would be apparent to those skilled in the art. A data signal 102 is illustrated with respect to operating at a frequency of 50 GHZ. A clock signal 102 then executes at 100 GHZ or twice the frequency of the data signal 102. An output signal 104 is illustrated that is also provided at a frequency of 50 GHZ. The output signal transitions with the positive edge of the clock signal 104. The ECL flip-flop of the present invention can operate at data signals of 50 GHZ and clock signals of 100 GHZ and provide high fidelity with low distortion.

Figure 7:
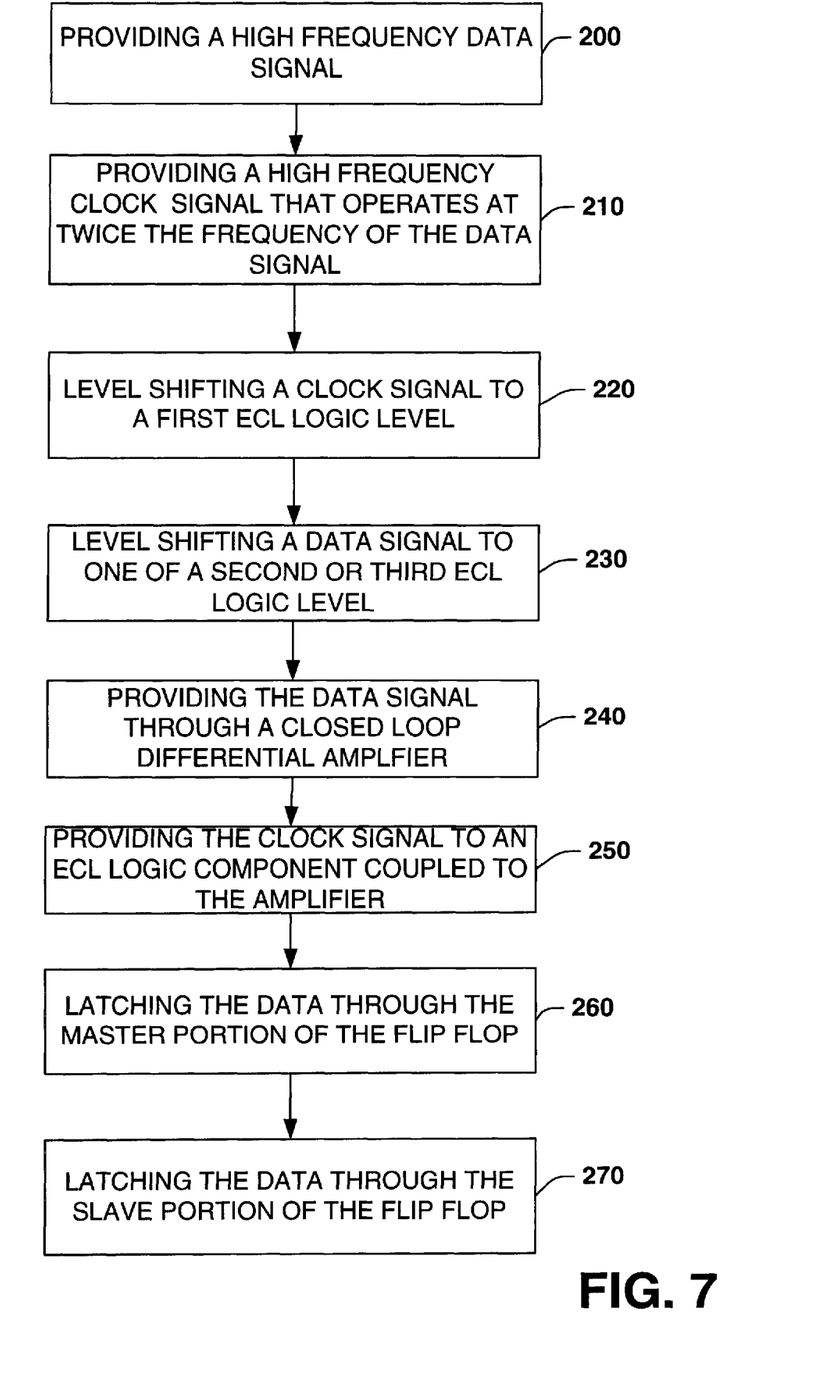
FIG. 7 illustrates a flow diagram of a methodology for operating an ECL flip-flop in accordance with an aspect of the present invention.

In view of the foregoing structural and functional features described above, a methodology in accordance with various aspects of the present invention will be better appreciated with reference to FIG. 7. While, for purposes of simplicity of explanation, the methodology of FIG. 7 is shown and described as executing serially, it is to be understood and appreciated that the present invention is not limited by the illustrated order, as some aspects could, in accordance with the present invention, occur in different orders and/or concurrently with other aspects from that shown and described herein. Moreover, not all illustrated features may be required to implement a methodology in accordance with an aspect of the present invention.

FIG. 7 illustrates a methodology for operating an ECL flip-flop in accordance with an aspect of the present invention. The methodology begins at 200 where a high frequency (e.g., 30–60 GHZ) data signal is provided. At 210, a high frequency clock signal is provided that operates at twice the frequency (e.g., 60–120 GHZ) of the data signal. At 220, the clock signal is level shifted to a first ECL logic level, for example, through a single emitter follower. At 230, the data signal is level shifted to a second or third ECL logic level, for example, through two cascaded emitter followers or through three cascaded emitter followers. The methodology then proceeds to 240. At 240, the data signal is provided through a closed loop differential amplifier. At 250, the clock signal is provided to an ECL logic component coupled to the closed loop differential amplifier. The ECL logic component executes a clock function and provides the appropriate differential data signal to the master portion of the ECL flip-flop. The master portion of the flip-flop then latches the data of the differential data signal at 260, which provides the differential data to the input of the slave portion of the ECL flip-flop. At 270, the slave portion of the flip-flop latches the differential data signal to the output of the slave portion upon receiving the next clock signal transition.

What has been described above includes exemplary implementations of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. An Emitter Coupled Logic (ECL) flip-flop comprising:
   an ECL logic component that receives a clock input signal at a first voltage level range;
   a differential comparator that receives a data input signal at a second voltage level range, the second voltage level range being at a voltage range lower than the first voltage level range;
   a master latch portion operative to receive an input signal that corresponds to the data input signal, the ECL logic component and the differential comparator cooperate to provide the input signal to the master latch portion which latches the input signal to its output on a first clock transition; and
   a slave latch portion that receives the input signal from the master latch portion and latches the input signal to its output upon a second clock transition.

2. The ECL flip-flop of claim 1, the first voltage level range being a single ECL logic level below ground and the second voltage level range being two ECL logic levels below ground.

3. The ECL flip-flop of claim 1, the first voltage level range being a single ECL logic level below ground and the second voltage level range being three ECL logic levels below ground.

4. The ECL flip-flop of claim 1, the differential comparator being a closed loop differential comparator.

5. The ECL flip-flop of claim 1, the ECL logic component comprising a first differential comparator having a first transistor and a second transistor and a second differential comparator having a first transistor and a second transistor, the state of the first transistors being controlled by a negative rail of the clock input signal and the state of the second transistors being controlled by a positive rail of the clock input signal.

6. The ECL flip-flop of claim 5, the collector of the second transistor of the first differential comparator is coupled to a first resistor at a first node, the second transistor of the second differential comparator is coupled to a second resistor at a second node, the first and second resistors connecting the first node and the second node to ground, the first node and the second node provide the input signal to the master latch portion.

7. The ECL flip-flop of claim 1, the data input signal executes at a frequency of about 30 GHZ to about 60 GHZ and the clock input signal executes at a frequency of about twice the frequency of the data input signal.

8. The ECL flip-flop of claim 1 being fabricated from Indium Phoshide (InP).

9. The ECL flip-flop of claim 1 being fabricated from Gallium Arsenide (GaA).

10. The ECL flip-flop of claim 1 being a D-type flip-flop.

11. A D-type Emitter Coupled Logic (ECL) flip-flop apparatus comprising:

means for level shifting a clock signal to a first voltage level range;

means for level shifting a data input signal to a second voltage level range, the second voltage level range being at a lower voltage range than the first voltage level range; and means for clocking the data input signal to a master latch portion of the ECL flip-flop apparatus.

12. The ECL flip-flop of claim 11, the first voltage level range being about −0.8 volts to about −1.6 volts and the second voltage level range being about −1.6 volts to about −2.4 volts.

13. The ECL flip-flop of claim 11, the first voltage level range being about −0.8 volts to about −1.6 volts and the second voltage level range being about −2.4 volts to about −3.2 volts.

14. The ECL flip-flop of claim 11, the means for clocking the data input signal to a master latch portion of the ECL flip-flop comprising a closed loop differential amplifier that receives the data input signal at the second voltage level range and an ECL logic component that receives the clock input signal at the first voltage level range.

15. The ECL flip-flop of claim 1, the ECL logic component performs a clocking function to clock the data input signal to the master latch portion of the flip-flop.

16. A method for operating an Emitter Coupled Logic (ECL) flip-flop, the method comprising:

providing a clock input signal;

level shifting the clock input signal to a first ECL logic level;

providing a data signal;

level shifting a data signal to a second ECL logic level lower than the first ECL logic level;

providing the data signal through a differential amplifier;

providing the clock signal to an ECL logic component coupled to the differential amplifier; and latching the data to an output of the ECL flip-flop.

17. The method of claim 16, the providing a data signal comprising providing a data signal at a frequency of about 30 GHZ to about 60 GHZ and the providing a clock input signal comprising providing a clock input signal at a frequency of about twice the frequency of the data signal.

18. The method of claim 17, the level shifting the clock signal comprising level shifting the clock signal through a single emitter follower from a ground state and the level shifting the data signal comprising level shifting the data signal through at least two cascaded emitter followers from a ground state.

19. The method of claim 17, further comprising providing feedback from the outputs of the differential comparator to the inputs of the differential comparator.

20. The method of claim 17, the ECL flip-flop being a D-type flip-flop.

* * * * *